United States Patent
Marr

(10) Patent No.: US 7,183,792 B2
(45) Date of Patent: Feb. 27, 2007

(54) METHOD AND SYSTEM FOR DETECTING A MODE OF OPERATION OF AN INTEGRATED CIRCUIT, AND A MEMORY DEVICE INCLUDING SAME

(75) Inventor: Kenneth W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 584 days.

(21) Appl. No.: 10/405,328

(22) Filed: Apr. 1, 2003

(65) Prior Publication Data

US 2004/0199841 A1     Oct. 7, 2004

(51) Int. Cl.
*H03K 19/00* (2006.01)
*H03K 19/173* (2006.01)
*G06F 11/00* (2006.01)

(52) U.S. Cl. ............................ 326/16; 326/38; 326/59; 714/24; 714/25; 714/733

(58) Field of Classification Search ............... 326/16, 326/37–38, 59
See application file for complete search history.

(56) References Cited

U.S. PATENT DOCUMENTS

| | | | | |
|---|---|---|---|---|
| 4,855,956 A * | 8/1989 | Urai | ............................ | 365/210 |
| 5,118,968 A | 6/1992 | Douglas et al. | ............... | 307/362 |
| 5,155,704 A | 10/1992 | Walther et al. | .............. | 365/201 |
| 5,486,867 A * | 1/1996 | Hsu et al. | .................... | 348/516 |
| 5,523,705 A * | 6/1996 | Steele | .......................... | 326/39 |
| 5,944,845 A | 8/1999 | Miller, Jr. | .................... | 714/724 |
| 6,028,798 A | 2/2000 | Roohparvar | ................. | 365/201 |
| 6,138,255 A * | 10/2000 | Noji | ............................ | 714/719 |
| 6,141,276 A | 10/2000 | Mullarkey et al. | ........... | 365/203 |
| 6,459,325 B1 * | 10/2002 | Hall et al. | .................... | 327/391 |
| 6,536,004 B2 | 3/2003 | Pierce et al. | ................. | 714/719 |
| 6,590,407 B2 | 7/2003 | Habersetzer et al. | ......... | 324/763 |
| 6,707,747 B2 * | 3/2004 | Zitlaw et al. | ................ | 365/227 |
| 6,747,470 B2 * | 6/2004 | Muhtaroglu et al. | ......... | 324/765 |
| 6,762,617 B2 * | 7/2004 | Iwase et al. | ................... | 326/11 |
| 6,845,407 B1 * | 1/2005 | Park et al. | .................... | 710/14 |
| 6,976,200 B1 * | 12/2005 | Ohbayashi | ................... | 714/727 |

* cited by examiner

*Primary Examiner*—James Cho
*Assistant Examiner*—Jason Crawford
(74) *Attorney, Agent, or Firm*—Dorsey & Whitney LLP

(57) ABSTRACT

A threshold detection circuit for developing a mode trigger signal includes an input that receives an input signal. In response to the input signal having approximately an input threshold value for a triggering time, the threshold detection circuit activates the mode trigger signal on an output. In response to the input signal being substantially different from the input threshold value or the input signal not having the input threshold value for the triggering time, the circuit deactivates the mode trigger signal. The threshold detection circuit may be contained in a variety of different mode detection circuits for detecting when an integrated circuit is to be placed in a test mode or other desired mode of operation, and such mode detection circuits may be contained in a variety of different types of integrated circuits, such as memory devices generally and SRAMs specifically.

42 Claims, 4 Drawing Sheets

METHOD AND SYSTEM FOR DETECTING A MODE OF OPERATION OF AN INTEGRATED CIRCUIT, AND A MEMORY DEVICE INCLUDING SAME

TECHNICAL FIELD

The present invention relates generally to semiconductor integrated circuits, and more specifically to detecting conditions associated with the operation of semiconductor integrated circuits such as memory devices.

BACKGROUND OF THE INVENTION

In semiconductor memory devices and other semiconductor integrated circuits, the devices are typically placed in a test mode of operation during manufacture to ensure that the devices operate as required. A variety of different techniques are utilized to place the device in the a particular mode of operation, such as a test mode of operation. For example, in a dynamic random access memory ("DRAM"), a particular sequence of applied control signals may be applied to place the device in the test mode of operation, such as activating a column address strobe signal $\overline{CAS}$ before a row address signal $\overline{RAS}$, which does not occur during normal operation of the memory device. Another conventional method for placing a memory device in a test mode of operation is to apply a "supervoltage" to a particular pin of the memory device. The supervoltage has a value greater than the normal operating range of signals applied on the pin, and when circuitry within the memory device senses the supervoltage, the device begins operating in the test mode.

In some situations, however, a particular technology limits the utilization of the supervoltage approach to placing the memory device in the test mode. For example, in a static random access memory ("SRAM"), at least some external pins of the memory typically include diodes coupled between the pin and a supply voltage to provide clamping of signals applied to the pin. FIG. 1 is a functional diagram illustrating an external pin 100 of an SRAM coupled to internal circuitry 102 in the SRAM. A clamping diode 104 is coupled between the external pin and a supply voltage VCC to limit or "clamp" voltages on the external pin 100 and thereby prevent such voltages from damaging the internal circuitry 102. When such diodes 104 are utilized, it is not possible to apply a supervoltage to the external pin 100 to place the SRAM in a test mode of operation since the clamping diode 104 limits the voltage on the external pin to a threshold voltage VT of the diode above the supply voltage VCC. This is true because the clamping diode 104 prevents the voltage on the pin from being driven to a level sufficiently above normal operating levels to allow the internal circuitry 102 to reliably detect the presence of the supervoltage and place the SRAM in the test mode of operation. Moreover, a permissible range of values for the supply voltage VCC may include the value VCC+VT and thus this voltage cannot not be used to place the SRAM in the test mode.

With any technique for placing an integrated circuit in a test mode of operation, it must be extremely unlikely that the test mode can be inadvertently entered by a user of the memory device. It must be extremely unlikely that the test mode will be inadvertently entered because entering the test mode will typically render the device inoperable. For example, in a typical memory device, during the test mode redundant circuits are utilized to replace defective elements in the device. If the test mode of the device is reentered, such redundant elements are typically disabled to allow for testing of the device. Thus, if a customer were to inadvertently enter the test mode, the device would become inoperable since the redundant elements being utilized to replace defective elements in the memory device will be disabled.

There is a need for a reliable technique to place a wide variety of integrated circuits into a test or other desired mode of operation where the use of one or more of the existing approaches is not viable.

SUMMARY OF THE INVENTION

According to one aspect of the present invention, a method of detecting a mode of operation of an integrated circuit includes receiving a signal having a first level corresponding to a first logic state and a second level corresponding to a second logic state. The signal has a midpoint being defined between the first and second logic states. The method detects whether the signal is approximately at the midpoint and when the signal is detected at the midpoint, the mode of operation is detected. The detected mode of operation may be a test or other mode of operation of the integrated circuit.

DETAILED DESCRIPTION OF THE INVENTION

Figure 2A:
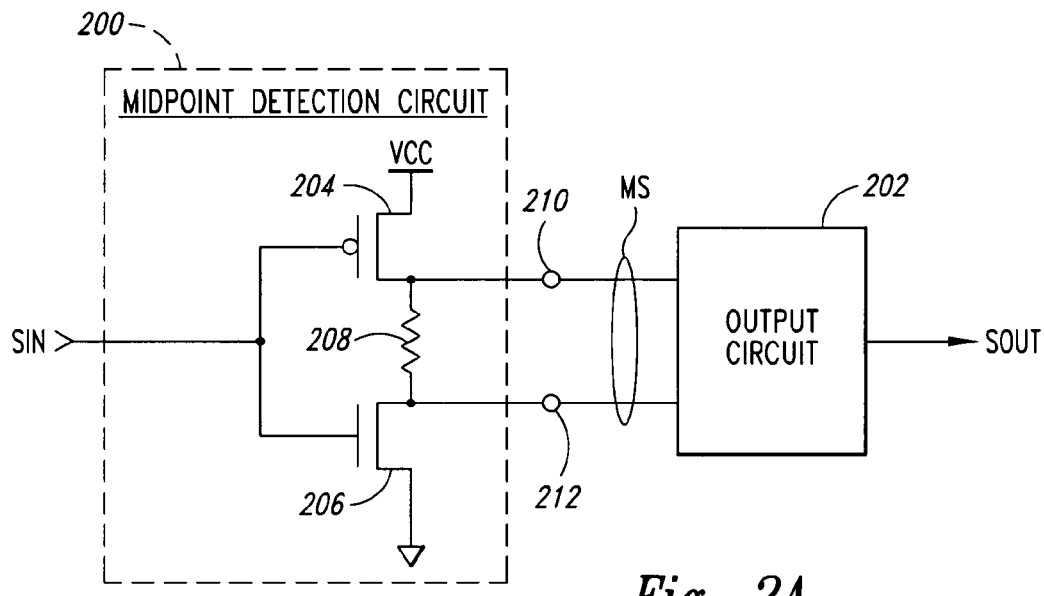
FIG. 2A is a functional block diagram of midpoint detection circuit and output circuit according to one embodiment of the present invention.

FIG. 2A is a functional block diagram of a midpoint detection circuit 200 that detects a midpoint MP of an input signal SIN and generates a midpoint signal MS indicating whether the midpoint level has been detected, with the MS signal being utilized to indicate a variety of different conditions such as a specific mode of operation to be entered by an output circuit 202 receiving the MS signal, as will be described in more detail below. A myriad of different types of circuits can receive the MS signal and perform some operation in response to that signal, and in FIG. 2A these circuits are illustrated generically as the output circuit 202 that generates an output signal SOUT responsive to the MS signal.

In the following description, certain details are set forth to provide a sufficient understanding of the present invention, but one skilled in the art will appreciate that the invention may be practiced without these particular details. Furthermore, one skilled in the art will appreciate that the example embodiments described below do not limit the scope of the present invention, and will also understand that various modifications, equivalents, and combinations of the disclosed example embodiments and components of such embodiments are within the scope of the present invention. The operation of well known components has not been shown or described in detail in the following description to avoid unnecessarily obscuring the present invention.

Figure 2B:
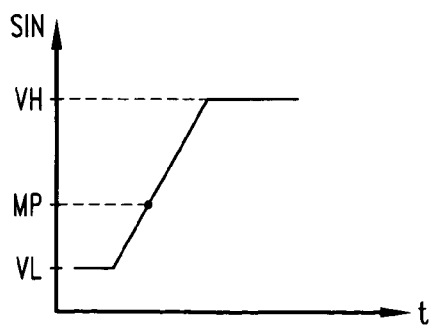
FIG. 2B is a signal diagram illustrating a sample of the input signal applied to the midpoint detection circuit of FIG. 2A.

The SIN signal may be any type of signal having a high voltage VH corresponding to a first logic state and a low voltage VL corresponding to a second logic state. The midpoint of the SIN signal detected by the detection circuit 200 is designated MP in the signal diagram of FIG. 2B, and may lie anywhere between the high voltage VH and low voltage VL. Thus, the midpoint MP need not necessarily lie exactly at the half way point between the two voltages (i.e., need not be at (VL+(VH−VL))/2). The significance of the SIN signal being at the midpoint MP may indicate any of a variety of conditions, desirable or undesirable, and the SIN signal may need to remain at the midpoint for a long or short duration depending on the condition being detected by the midpoint detection circuit 200, as will be described in more detail below.

In one embodiment, the midpoint detection circuit 200 is formed by a PMOS transistor 204 and NMOS transistor 206 coupled to form a conventional inverter except that a resistor 208 is coupled between an output node 210 corresponding to the drain of the PMOS transistor and an output node 212 corresponding to the drain of the NMOS transistor. The midpoint signal MS corresponds to the voltage across the resistor 208 and hence across nodes 210/212 in this embodiment. Each of the transistors 204, 206 has an associated threshold voltage VT, and the midpoint MP corresponds to a voltage value where the gate-to-source voltage of each transistor is greater than the associated threshold voltage so that both transistors are turned ON at the same time. In one embodiment of the midpoint detection circuit 200 formed by the transistors 204, 206 and the resistor 208, the circuit operates at 0.5 volts and a current ranging from 200 microamps to 10 milliamps, with the resistor having a value ranging from 50 ohms to 2500 ohms.

In operation, when the SIN signal is at the midpoint MP, both transistors 204, 206 are turned ON, and current flows from the supply voltage source VCC through the series connected PMOS transistor, resistor 208, and NMOS transistor. In response to this current through the resistor 208, a voltage develops across the nodes 210, 212 which corresponds to the MS signal. Thus, when the SIN signal is at the midpoint MP the MS signal has a non-zero voltage corresponding to the voltage across nodes 210, 212. In contrast, when the SIN signal is at a level other than the midpoint MP, one of the transistors 204, 206 is turned OFF, resulting in no current to flow through the resistor 208 and thereby driving the voltage of the MS signal to approximately zero. Accordingly, when the SIN signal is at the midpoint MP the detection circuit 200 outputs a non-zero MS signal and otherwise outputs an approximately zero MS signal. In response to the MS signal, the output circuit 202 drives the SOUT signal to a first value when the MS signal is non-zero and to a second level when the MS signal is approximately zero. The SOUT signal thus has the first value when the SIN signal is at the midpoint MP and has the second value otherwise. The output circuit 202 can be formed by a differential amplifier or an operational amplifier that operates in response to the MS signal to generate the SOUT signal, and suitable circuitry for forming each of these amplifiers will be understood by those skilled in the art.

Figure 3:
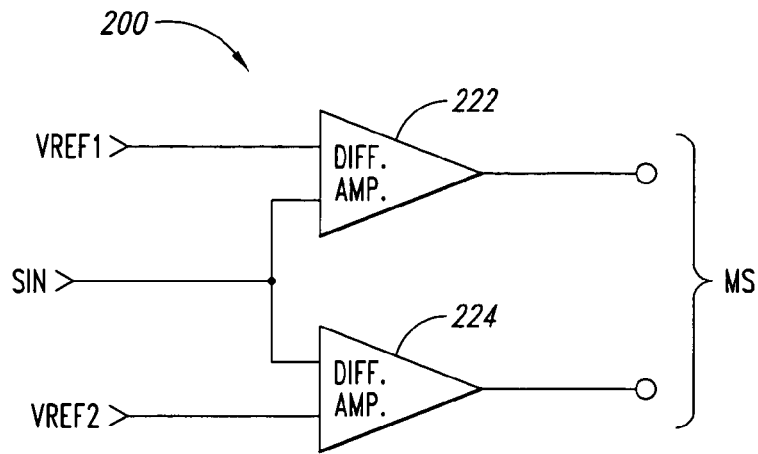
FIG. 3 is a functional block diagram of another embodiment of the midpoint detection circuit 200 of FIG. 2A.

FIG. 3 is a functional block diagram of another embodiment of the midpoint detection circuit 200 of FIG. 2A. In this embodiment, the midpoint detection circuit 200 is formed by a pair of differential amplifiers 222, 224, each receiving a respective reference voltage VREF1, VREF2 on one input and having a second input receiving the SIN signal. In this embodiment, output signals from the differential amplifiers 222, 224 correspond to the MS signal, and the output circuit 202 (FIG. 2A) is formed by logic circuitry that develops the SOUT signal responsive to the MS signal. In operation, when the SIN signal is at the midpoint MP, which is within a range of values between two logic states, each differential amplifier 222, 224 drives its corresponding output signal to an activation level. When the output circuit 202 (FIG. 2A) receives output signals from both differential amplifiers 222, 224 having the activation level, the output circuit activates the SOUT signal. When the SIN signal has a value other than the midpoint MP, only one of the output signals from the differential amplifiers 222, 224 but not both are at the corresponding activation level, and in this situation the logic circuitry deactivates the SOUT signal.

As previously mentioned, the significance of the SIN signal being at the midpoint MP and thus the generation of the MS signal may indicate any of a variety of conditions. For example, the midpoint detection circuit 200 may be contained in a memory device such as a DRAM and the generation of the MS signal upon detection of SIN signal at the midpoint MP utilized to change the width of a data bus DQ of the DRAM, such as from a width of 16 bits to a width of 8 bits. Another example is the entry of a particular configuration mode of a DRAM upon detection of the SIN at the midpoint MP, such as the mode of a conventional DRAM in which data is stored in a load mode register to set such operating parameters as burst length and type for the DRAM. Alternatively, the detection of the SIN signal at the midpoint MP for a certain time may indicate a problem with the DRAM or other device, and the corresponding MS signal may correspond to a warning or repair signal upon which action may be taken to eliminate the problem. In still another example, the midpoint detection circuit 200 can operate as an address transition detector, such as is contained in an asynchronous SRAM to detect the transition of address signals applied to the SRAM so that other operations in the SRAM can performed relative to the detection of such address transitions. In all these examples, the SIN signal corresponds to some signal applied to the memory or other device, such as an address signal in the address transition detector example. These examples are not intended to be an exhaustive list of applications for or embodiments of the present invention, and various modifications, equivalents, and combinations of the disclosed example embodiments and components thereof are within the scope of the present invention.

Figure 4:
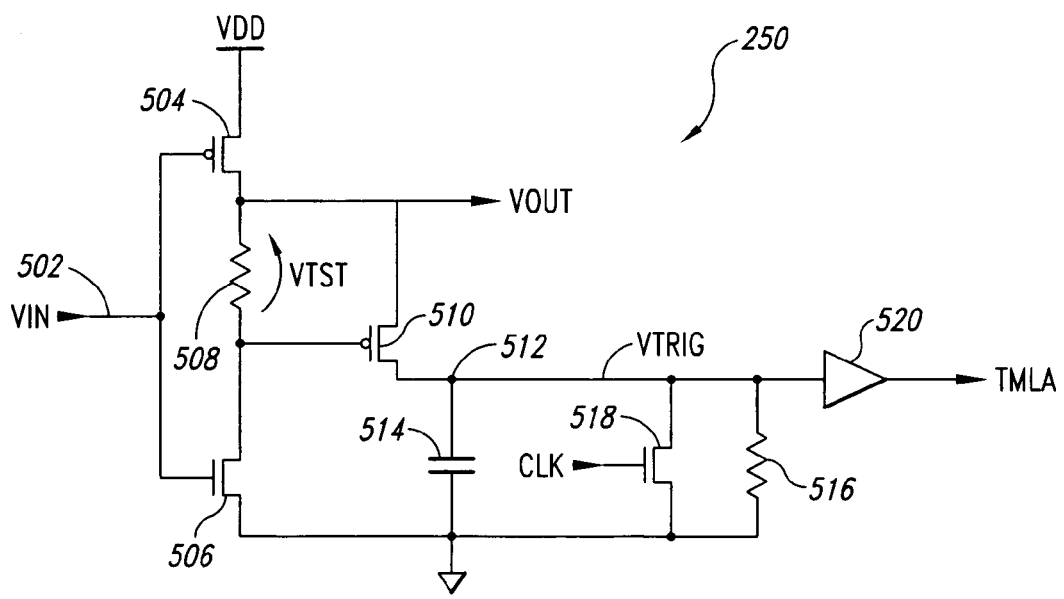
FIG. 4 is a schematic of a threshold detection circuit according to one embodiment of the present invention.

FIG. 4 is a schematic illustrating another embodiment of a threshold detection circuit 250 that detects when an applied input voltage signal VIN is maintained at a voltage threshold value for a required trigger time and activates a test mode latch signal TMLA when this is true, as will be explained in more detail below. The threshold detection circuit 250 is typically contained in a memory device or other integrated circuit, and is used to detect the input voltage signal VIN applied on an external terminal 502 of the device and to activate the TMLA signal when the signal VIN has the required characteristics to place the device in a test or other desired mode of operation. The threshold detection circuit 250 includes a PMOS transistor 504 and an NMOS transistor 506 coupled as in a conventional inverter circuit, except that a threshold resistor 508 is coupled between the respective drains of the transistors. In operation, the transistors 504, 506 operate in one of two modes, a normal mode and a test mode. In the normal mode, the transistors 504, 506 operate as they do in a conventional inverter in response to the applied input voltage signal VIN being at first and second voltage levels corresponding to first and second binary logic states. Thus, when the applied input voltage signal VIN is low, the transistor 506 turns OFF and the transistor 504 turns ON, driving an output voltage VOUT high. When the applied input voltage signal VIN is high, the transistor 506 turns ON and the transistor 504 turns OFF, driving the output voltage VOUT low. In the test mode, the input voltage signal VIN is maintained at a voltage threshold value, causing the transistors 504, 506 to simultaneously turn ON and causing current to flow through the threshold resistor 508 to thereby develop a test voltage VTST across the threshold resistor.

The term "voltage threshold value" is used relative to a device, such as an inverter, and corresponds to a voltage value or "trip point" that an applied input to the device must cross in order to initiate a change in the logic state of an output of the device. During normal operation of such a device, an applied input is not maintained at the voltage threshold value for any particular time, but instead the input merely passes through the threshold voltage as it transitions from one logic state to another. In other words, during the normal mode of operation, the input voltage signal VIN passes through the voltage threshold value when transitioning between logic states, and is thus only at the voltage threshold value for a very short time so that substantially no current flows through the resistor 508. In contrast, during the test mode, the input voltage signal VIN is maintained at approximately the voltage threshold value so that the test voltage VTST develops across the resistor 508.

The threshold detection circuit 250 further includes a PMOS transistor 510 having its gate and source coupled across the resistor 508 and having its drain coupled to a charging node 512. A capacitor 514 and resistor 516 are coupled between the charging node 512 and ground, and when the transistor 510 turns ON in response to the test voltage VTST the capacitor begins charging. As the capacitor 514 is charging, a trigger voltage VTRIG on the node 512 begins increasing, with the rate at which the trigger voltage increases being a function of the values of the capacitor 514 and the resistor 516 as well as value of the test voltage VTST and the size of the transistor 510, as will be appreciated by those skilled in the art. An NMOS transistor 518 receives a clock signal CLK, and when the clock signal is active high the transistor turns ON to discharge the capacitor 514 and drive the trigger voltage VTRIG to approximately ground. A comparator 520 develops the test mode latch signal TMLA in response to the trigger voltage VTRIG, driving the TMLA signal active high when the trigger voltage is greater than a trigger value of the comparator, and driving the TMLA signal inactive low when the voltage is less than the trigger value.

In operation, the threshold detection circuit 250 operates in two modes, a normal mode and a test mode, which correspond to normal and test mode previously described with reference to the transistors 504, 506. In the normal mode, the input voltage signal VIN is either high or low, causing the transistors 504, 506 to alternately turn ON as previously described and drive the output voltage VOUT either low or high. When the transistors 504 and 506 are alternately activated, substantially no current flows through the resistor 508 so that the test voltage VTST is substantially zero. When the test voltage VTST is substantially zero, the transistor 510 is turned OFF because the gate-to-source voltage applied to the transistor is approximately zero, and the capacitor 514 is not charged. During the normal mode, the CLK signal toggles and periodically turns ON the transistor 518 when the CLK signal high, with the frequency of the CLK signal being sufficient to thereby drive the trigger voltage VTRIG low. In response to the low trigger voltage VTRIG, the comparator 520 drives the TMLA signal inactive low. Thus, in the normal mode the threshold detection circuit 250 operates as a conventional inverter and the TMLA signal is driven in active low.

During the test mode of operation, the input voltage signal VIN is maintained at the voltage threshold value, causing the transistors 504, 506 to both simultaneously turn ON and causing current to flow through the threshold resistor 508 to thereby develop the test voltage VTST across the threshold resistor. The CLK signal is driven inactive low during the test mode, turning OFF the transistor 518. In response to the test voltage VTST, the transistor 510 turns ON and the capacitor 514 begins charging. When the trigger voltage VTRIG reaches the trigger value of the comparator 520, the comparator drives the TMLA signal active high. Note that the test voltage VTST is developed across the threshold resistor 508 only as long as the input voltage signal VIN is maintained at approximately the voltage threshold value. Thus, the input voltage signal VIN must be maintained at approximately the voltage threshold value for a minimum time so that the test voltage VTST across the resistor 508 turns ON the transistor 510 to charge the capacitor 514 until the trigger voltage VTRIG exceeds the trigger value of the comparator 520. If the input voltage signal VIN deviates from approximately the voltage threshold value before this minimum time, the test voltage VTST will go to approximately zero as previously described, turning OFF the transistor 510 which, in turn, stops the charging of the capacitor 514. At this point, the trigger voltage VTRIG is less than the trigger value of the comparator 520 so the TMLA signal is maintained inactive low. It should also be noted that at this point the capacitor 514 begins discharging through the resistor 516.

Figure 1:
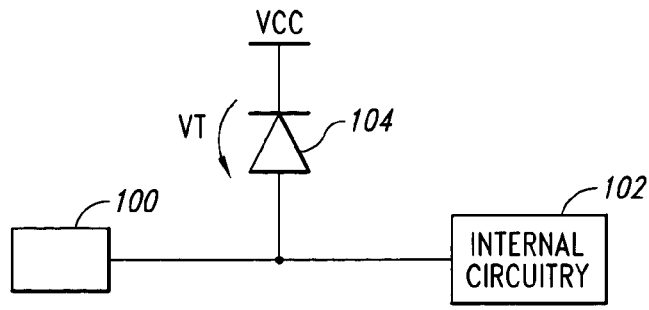
FIG. 1 is a simplified functional diagram of an external pin in a conventional SRAM.

The threshold detection circuit 250 may be formed in a variety of different types of integrated circuits, and utilized to detect a test mode of the integrated circuit via the test mode of the threshold detection circuit. Thus, when the integrated circuit containing the threshold detection circuit 250 is to be placed in a test mode of operation, the input voltage signal VIN is held at the voltage threshold value for a sufficient time to activate the TMLA signal and thereby place the integrated circuit in the test mode of operation. The threshold detection circuit 250 thus provides a reliable way to place an integrated circuit in a test mode of operation since it is very unlikely that during normal operation of the integrated circuit, the input voltage signal VIN would ever be maintained at the voltage threshold value for the minimum time required to activate the TMLA signal. In addition, note that the threshold detection circuit 250 eliminates the need for the use of a supervoltage to place the integrated circuit in the test mode. Moreover, unlike a supervoltage the voltage threshold value has a value between the high and low voltage levels of the input voltage signal VIN, and thus presents no concerns regarding clamping of the applied voltage by clamping diodes (see FIG. 1) coupled to pins of the integrated circuit. The threshold detection circuit 250 could also be utilized as a conventional inverter during the normal mode of operation, although typically a conventional inverter would be coupled in parallel with the threshold detection circuit for use during the normal mode.

In the threshold detection circuit 250, the speed of operation of the circuit can be increased by removing either the capacitor 514 or resistor 516, which may be useful in some applications of the circuit such as an address detection circuit where the VIN signal is only at the voltage threshold value or midpoint for a short time. Removal of the capacitor 514 allows the voltage VTRIG to develop across the resistor 516 as soon as transistor 510 turns ON. When the resistor 516 is removed, the voltage VTRIG across the capacitor 514 increases more quickly once the transistor 510 is turned ON. In both situations, the voltage VTRIG exceeds the trigger value of the comparator 520 more quickly, causing the comparator to drive the TMLA signal active more quickly in response to the VIN signal being at the midpoint.

Figure 5:
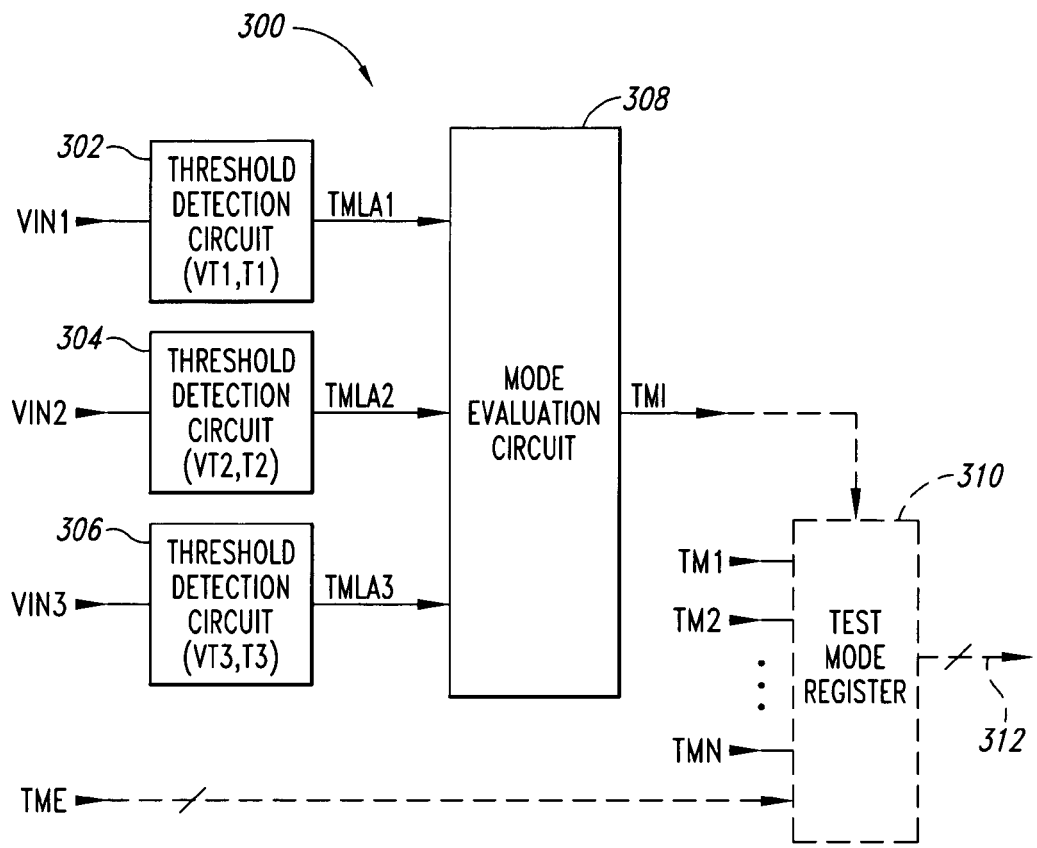
FIG. 5 is a functional block diagram illustrating one embodiment of a test mode detection circuit including a number of the threshold detection circuits of FIG. 4.

FIG. 5 is a functional block diagram illustrating one embodiment of a test mode detection circuit 300 including three threshold detection circuits 302–306, each of the threshold detection circuits being identical to the threshold detection circuit 250 of FIG. 4. Although three threshold detection circuits 302–306 are illustrated in the embodiment of FIG. 5, fewer or more threshold detection circuits may be included in alternative embodiments. Each of the threshold detection circuits 302–306 receives a corresponding input voltage signal VIN1–VIN3 applied to a corresponding pin of an integrated circuit containing the test mode detection circuit 300. Each threshold detection circuit 302–306 generates a corresponding test mode latch signal TMLA1–TMLA3 in the same manner as previously described with reference to the detection circuit 250 of FIG. 4. In the test mode detection circuit 300, a mode evaluation circuit 308 receives the test mode latch signals TMLA1–TMLA3 and activates a test mode indication signal TMI when all of the test mode latch signals are active. In this embodiment, the test mode indication signal TMI is the signal that places the integrated circuit containing the test mode detection circuit 300 into the test mode of operation.

The test mode detection circuit 300 allows multiple threshold detection circuits 302–306 to be utilized to place the integrated circuit into the test mode and thereby provides added protection against inadvertently entering the test mode. This is true because in order for the mode evaluation circuit 308 to activate the TMI signal, instead of a single input voltage signal, the three input voltage signals VIN1–VIN3 must be maintained at the corresponding voltage threshold values for the corresponding required times in order for the threshold detection circuits 302–306 to activate the TMLA114 TMLA3 signals. It is extremely unlikely that all of the input voltage signals VIN1–VIN3 would be maintained at the corresponding voltage threshold values for the required times. In FIG. 5, each of the threshold detection circuits 302–306 is shown as having an associated voltage threshold value VT1–VT3 and an associated time constant T1–T3. The voltage threshold values VT1–VT3 correspond to the voltage threshold values at which each of the input voltage signals VIN1–VIN3 must be maintained in order for the threshold detection circuits 302–306 to activate the TMLA1–TMLA3 signals, respectively. Thus, each of the circuits 302–306 may have a different voltage threshold value VT1–VT3 to provide added protection against inadvertent entry into the test mode. Each of the time constants T1–T3 corresponds to the time the corresponding input voltage signal VIN1–VIN3 must be maintained at the corresponding voltage threshold value VT1–VT3. In other words, each of the time constants T1–T3 corresponds to the time the signal VIN1–VIN3 must be maintained at the threshold value VT1–VT3 in order for the capacitor 514 (FIG. 4) to charge to the trigger voltage VTRIG. In the test mode detection circuit 300, the voltage threshold values VT1–VT3 may all be different or may all be the same, and the same is true of the time constants T1–T3.

Several alternative embodiments of the test mode detection circuit 300 are also illustrated in FIG. 5. In one alternative embodiment, the TMI signal is applied to a test mode register 310 that receives a plurality of test mode signals TM1–TMN on respective external terminals of the integrated circuit containing the test mode detection circuit 300. The test mode register 310 latches the TM1–TMN signals responsive to the TMI signal. The test mode register 310 also receives a test mode enable signal TME that is applied to an external terminal of the integrated circuit, and the register provides the latched TM1–TMN signals on an output 312 responsive to the TME signal going active. Each of the test mode signals TM1–TMN defines a particular test or mode to be executed during the test mode operation of the integrated circuit. For example, one test mode signal TM1–TMN may define the specific test data pattern to be written to memory cells contained within the integrated circuit, or may define a specific voltage stress test to be performed upon such memory cells. In this embodiment, when the TMI signals goes active the test mode register 310 latches the test mode signals TM1–TMN and when TME signal goes active the register 310 provides the latched test mode signals TM1–TMN on the output 312 to thereby invoke the test mode of operation.

In another alternative embodiment, the test mode detection circuit 300 includes only two threshold detection circuits 302 and 304, each of the threshold detection circuits coupled to a respective pin of a device containing the threshold detection circuit to receive a respective complementary logic signal. For example, the threshold detection circuits 302, 304 could receive complementary clock signals CLK and $\overline{CLK}$, respectively. The circuits 302, 304 thereafter operate in combination with the mode evaluation circuit 308 as previously described to generate the TMI signal to place the integrated circuit in the test mode. In this embodiment, the use of the threshold detection circuits 302, 304 on pins that receive complementary signals provides added protection against inadvertent entry into the test mode since it is extremely unlikely both the complementary signals would be maintained at the required input threshold values for the required times. In any of these alternative embodiments, the voltage threshold values VT1–VT3 and time constants T1–T3 of the threshold detection circuits 302–306 may be the same or different, as will be appreciated by those skilled in the art.

In the test mode detection circuit 300 of FIG. 5, the mode evaluation circuit 308 may be formed from a simple AND gate in some embodiments and from a state machine in other embodiments. For example, in one embodiment the circuit 300 includes a single threshold detection circuit 302, and in this embodiment the mode evaluation circuit 308 is a state machine that monitors the signal VIN1 applied on a corresponding pin to detect the test mode of operation. In this embodiment, the signal VIN1 is sequentially activated for different time constants, and the mode evaluation circuit 308 detects a required sequence of time constants for the signal VIN1 and activates the TMI signal when this sequence is detected. In embodiments where multiple threshold detection circuits 302 are utilized, the time constants of the corresponding signals VIN applied to the threshold detection circuits may be the same for each signal or may vary among signals. Similarly, the voltages of the signals VIN may each be the same or may vary among signals VIN in such multiple threshold detection circuit 302 embodiments. In other embodiments including multiple threshold detection circuits 302, both voltages and time constants may vary among signals VIN. The mode evaluation circuit 308 may be formed by a state machine in such multiple threshold detection circuit 302 embodiments. Where multiple threshold detection circuits 302 are utilized and the time constants of each are the same, the mode evaluation circuit 308 may be formed from an AND gate.

Figure 6:
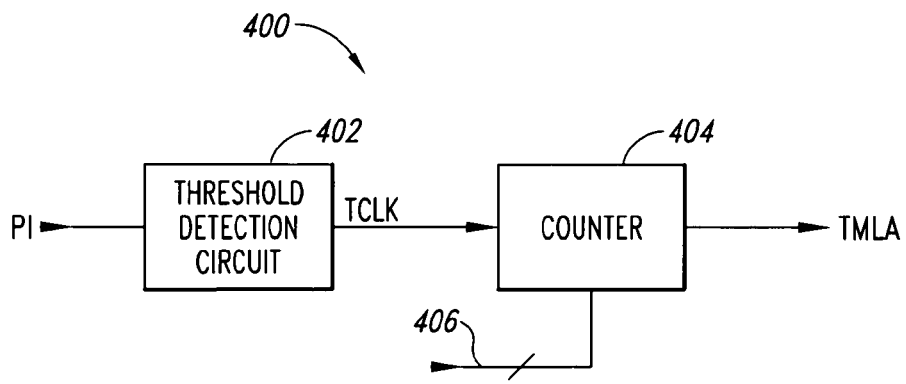
FIG. 6 is a functional block diagram illustrating another embodiment of a test mode detection circuit including the threshold detection circuit of FIG. 4.

FIG. 6 illustrates a test mode detection circuit 400 according to yet another embodiment of the present invention. The test mode detection circuit 400 includes a threshold detection circuit 402, which is identical to the threshold detection circuit 250 previously described with reference to FIG. 4. The threshold detection circuit 402 receives a pulse input signal PI that is a periodic signal maintained at the voltage threshold value of the detection circuit for a portion of the period of the signal and is maintained at a low logic level during the remainder of the period. The portion of the period for which the pulse input signal PI is maintained at the voltage threshold value is sufficient to cause the threshold detection circuit 402 to activate its output, which is indicated as a test clock signal TCLK in FIG. 6. The TCLK signal corresponds to the TMLA signal of the threshold detection circuit 250 previously described with reference to FIG. 4, but is designated as a clock signal to indicate that the signal is periodic in response to the periodic pulse input signal PI. The TCLK signal clocks a counter 404 that increments a count in response to being clocked, and activates the TMLA signal when the count reaches a desired value. The counter 404 may also receive additional signals 406 applied on external terminals of the integrated circuit containing the test mode detection circuit 400. When the counter 404 receives the additional signals 406, the counter 404 activates the TMLA signal when the count reaches the desired value and the signals 406 have predetermined values.

In operation, the counter 404 initially resets the count and the pulse input signal PI is applied to the threshold detection circuit 402 which, in turn, clocks the TCLK signal. In response to the TCLK signal, the counter 404 increments the count and when the count reaches the desired value and the additional signals 406 have the predetermined values, the counter activates the TMLA signal placing the integrated circuit containing the test mode detection circuit 400 into the test mode of operation. In the test mode detection circuit 400, the required periodic nature of the pulse input signal PI provides protection against inadvertent entry into the test mode of operation, as will be appreciated by those skilled in the art.

Figure 7:
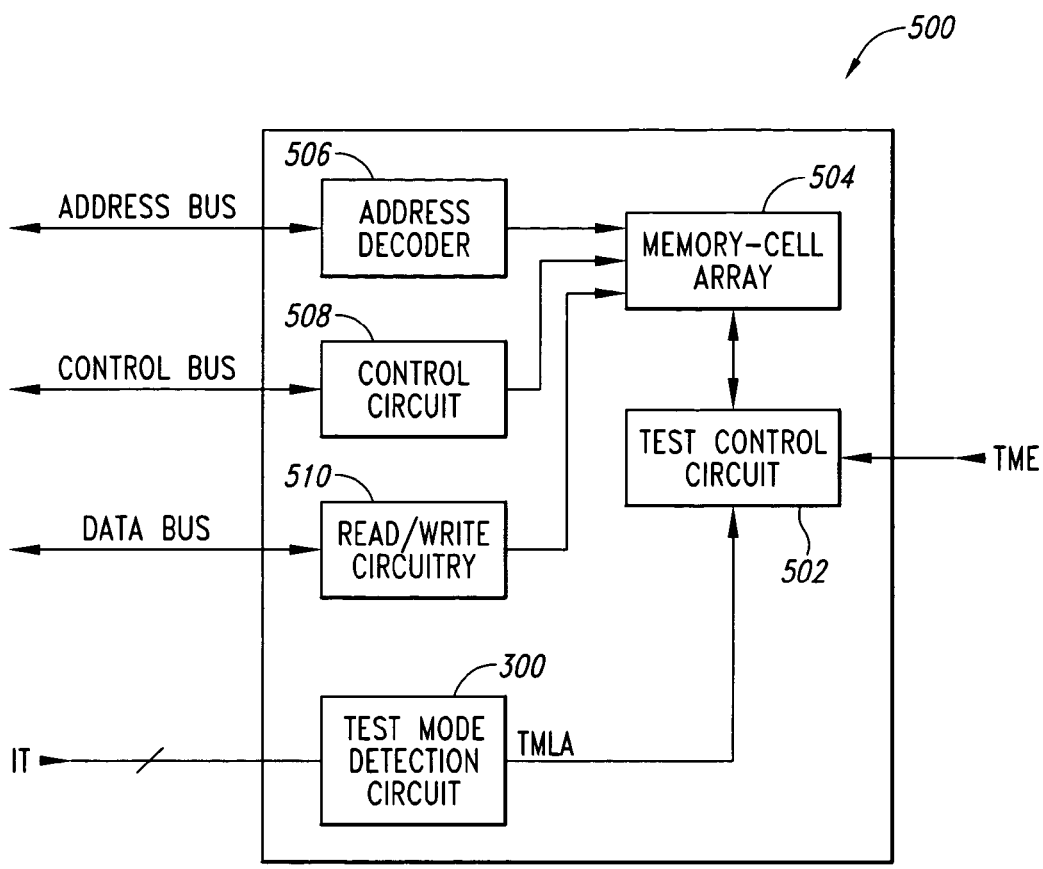
FIG. 7 is a functional block diagram of a memory device including the test mode detection circuit of FIG. 5 or 6 and/or the threshold detection circuit of FIGS. 2 and 3 according to one embodiment of the present invention.

FIG. 7 is a block diagram of a memory device 500 including the test mode detection circuit 300 of FIG. 5. Although the memory device 500 is shown as including the circuit 300, the test mode detection circuit 400 of FIG. 6 and any of the various embodiments of the test mode detection circuits previously described may be contained in the memory device. In addition, the memory device 500 may contain the threshold detection circuit 200 of FIGS. 2–3 as well for placing the memory device in a test or some other mode of operation as previously discussed. In response to the IT signals applied to the memory device 500, the test mode detection circuit 300 provides the TMLA signal to a test control circuit 502. The test control circuit 502 is coupled to a memory-cell array 504 and controls test data being transferred to and from memory cells (not shown) in the array during one of many possible test modes of operation. The test control circuit 502 places the memory device 500 in the test mode of operation when the TMLA signal is active and a test mode enable signal TME applied on an external terminal of the memory device is also active. The TME signal may be omitted in other embodiments of the test control circuit 502. The memory device 500 further includes an address decoder 506, a control circuit 508, and read/write circuitry 510, all of which are conventional and known in the art. The address decoder 506, control circuit 508, and read/write circuitry 510 are all coupled to the memory-cell array 504. In addition, the address decoder 506 is coupled to an address bus, the control circuit 508 is coupled to a control bus, and the read/write circuitry 510 is coupled to a data bus.

In operation, external circuitry (not shown) provides address, control, and data signals on the respective busses to the memory device 500. During a read cycle, the external circuitry provides a memory address on the address bus and control signals on the control bus to the memory device 10. In response to the memory address on the address bus, the address decoder 506 provides a decoded memory address to the memory-cell array 504 while the control circuit 508 provides control signals to the memory-cell array 504 in response to the control signals on the control bus. The control signals from the control circuit 508 control the memory-cell array 504 to provide data to the read/write circuitry 510. The read/write circuitry 510 then provides this data on the data bus for use by the external circuitry. During a write cycle, the external circuitry provides a memory address on the address bus, control signals on the control bus, and data on the data bus. Once again, the address decoder 506 decodes the memory address on the address bus and provides a decoded address to the memory-cell array 504. The read/write circuitry 510 provides the data on the data bus to the memory-cell array 504 and this data is stored in the addressed memory cells in the memory-cell array under control of the control signals from the control circuit 508. During the test mode of operation, the external circuit provides the IT signals to the circuit 300, which, in turn, activates the TMLA signal when the IT signals have the required characteristics. The external circuit also activates the TME signal, and when the TME and TMLA signals are active, the test control circuit 502 test the memory cells in the array 504. The memory device 500 may be any of a variety of different types of memory device, such as an SRAM, MRAM, DRAM, SDRAM, DDR DRAM, SLDRAM, and RAMBUS DRAM. Moreover, the circuit 300 may be placed in integrated circuits other than memory devices, such as digital signal processors and microprocessors, and the circuit 300 may be used to activate modes of operation other than a test mode.

Figure 8:
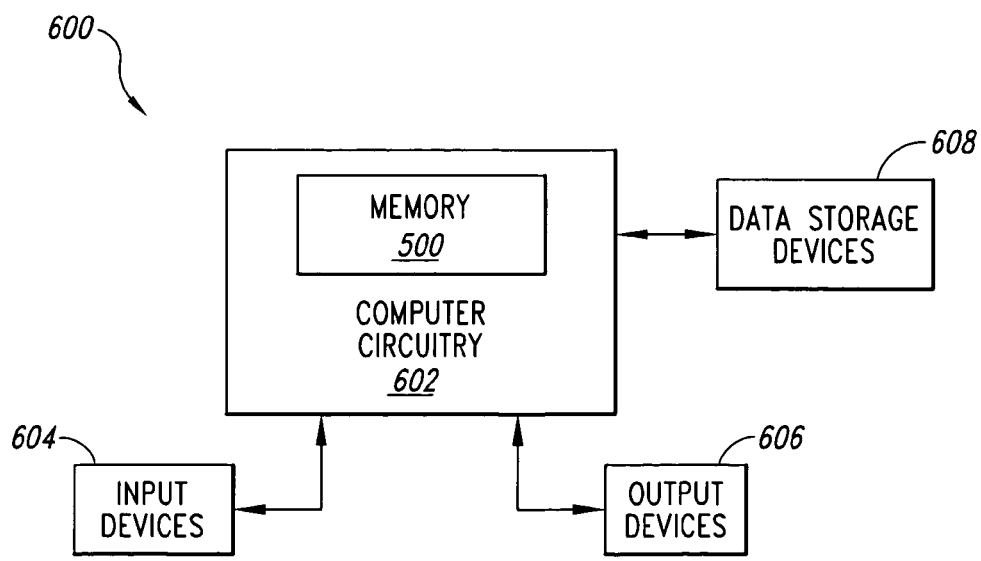
FIG. 8 is a functional block diagram of a computer system including the memory device of FIG. 7.

FIG. 8 is a block diagram of a computer system 600 which uses the memory device 500 of FIG. 7. The computer system 600 includes computer circuitry 602 for performing various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or a video terminal. One or more data storage devices 608 are also typically coupled to the computer circuitry 602 to store data or retrieve data from external storage media (not shown). Examples of typical data storage devices 608 include hard and floppy disks, tape cassettes, and compact disk read only memories (CD-ROMs). The computer circuitry 602 is typically coupled to the memory device 500 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

The invention claimed is:

1. A method of detecting a test mode of operation of an integrated circuit, the integrated circuit including an external terminal coupled to an input circuit contained within the integrated circuit, the input circuit having an input threshold value, and the method comprising:
applying a test signal to the external terminal;
and detecting a test mode of operation when the applied test signal is maintained at approximately the input threshold value for a triggering time and a second test signal applied on a second external has a value.

2. The method of claim 1 wherein the input threshold value comprises a voltage threshold having a value.

3. The method of claim 1 wherein the input circuit contained within the integrated circuit comprises an inverter.

4. The method of claim 1 wherein the value of the second test signal comprises a binary value.

5. A method of detecting a test mode of operation of an integrated circuit, the integrated circuit including a plurality of external terminals, each external terminal being coupled to an input circuit contained within the integrated circuit and each input circuit having an input threshold value, the method comprising:
applying respective test signals to two of the external terminals that correspond to a pair of complementary signals; and
detecting a test mode of operation when each of the respective applied test signals is maintained at approximately the corresponding input threshold value for a corresponding triggering time.

6. The method of claim 5 wherein detecting a test mode of operation comprises detecting a test mode of operation when each of the respective test signals is maintained at approximately the corresponding input threshold value for the corresponding triggering time, and each of the triggering times has a different value.

7. The method of claim 6 wherein detecting the test mode of operation further comprises detecting the test mode of operation when a test signal applied on an external terminal has a value.

8. The method of claim 5 wherein each of the input threshold values has a different value.

9. The method of claim 5 wherein the input threshold value comprises a voltage threshold having a value.

10. The method of claim 5 wherein each of the input circuits contained within the integrated circuit comprises an inverter.

11. A threshold detection circuit for developing a mode trigger signal, comprising:
an input adapted to receive an input signal;
an output;
first and second switching circuits having control terminals adapted to receive the input signal and first and second signal terminals, the first and second signal terminals of the first switching circuit being coupled between a supply voltage source and a first terminal of a load element, and the first and second terminals of the second switching circuit being coupled between a reference voltage source and a second terminal of the load element, the first and second switching circuits operable in responsive to the input signal having approximately a voltage threshold value to turn on and develop a trigger voltage across the load element, and operable to alternately turn on responsive to the input signal being substantially different from the voltage threshold value to develop substantially no voltage across the load element;
a third switching circuit coupled across the load element, the third switching circuit developing a charging signal on an output to responsive to the trigger voltage; and
an energy storage element coupled to the output of the third switching circuit to receive the charging signal, the energy storage element storing energy from the charging signal to develop the mode trigger signal, the developed mode trigger signal having a value that is a function of a rate at which the storage element stores energy and the duration that the input voltage is approximately at the voltage threshold value; and
wherein the threshold detection circuit is operable in response to the input signal having approximately an input threshold value for a triggering time to activate the mode trigger signal on the output; and
wherein the threshold detection circuit is operable in response to the input signal being substantially different from the input threshold value or the input signal not having the input threshold value for the triggering time to deactivate the mode trigger signal on the output.

12. The threshold detection circuit of claim 11,
wherein the first and third switching circuits comprise PMOS transistors;
wherein the second switching circuit comprises an NMOS transistor;
wherein the load element comprises a resistor; and
wherein the energy storage element comprises
a capacitor coupled between a reference voltage source and the output of the third switching circuit
a resistor coupled in parallel with the capacitor; and
a transistor having signal terminals coupled in parallel with the capacitor and having a control terminal adapted to receive a clock signal, the transistor coupling the signal terminals together to discharge the capacitor responsive to the clock signal.

13. The threshold detection circuit of claim 12 wherein the energy storage circuit further comprises a comparator having an input coupled to the output of the third switching circuit and having an output, the comparator activating a mode latch signal on its output responsive to the mode trigger signal exceeding a threshold value.

14. A test mode detection circuit for developing a test mode latch signal indicating a test mode of operation of an integrated circuit is to be entered, the test mode detection circuit comprising:
a threshold detection circuit having an input adapted to receive an input test signal and having an output, the threshold detection circuit operable in response to the input test signal having approximately an input threshold value for a triggering time to activate a test mode clocking signal on the output, and operable in response to the input test signal being substantially different from the input threshold value or the input signal not having the input threshold value for the triggering time to deactivate the test mode clocking signal on the output; and a counter circuit coupled to the output of the threshold detection circuit to receive the test mode clocking signal, the counter circuit incrementing a count responsive to being clocked by the test mode clocking signal and the counter circuit activating the test mode latch signal when the count reaches a desired value.

15. The test mode detection circuit of claim 14 wherein the counter circuit increments the count responsive to each cycle of the test mode clock signal where a cycle corresponds to a period from a first time that the clock signal goes active to the next time the clock signal goes active.

16. The test mode detection circuit of claim 14 wherein the input test signal corresponds to an input test voltage and the input threshold value corresponds to a voltage threshold value.

17. The test mode detection circuit of claim 16 wherein the threshold detection circuit comprises:

first and second switching circuits having control terminals adapted to receive the input test voltage and first and second signal terminals, the first and second signal terminals of the first switching circuit being coupled between a supply voltage source and a first terminal of a load element, and the first and second terminals of the second switching circuit being coupled between a reference voltage source and a second terminal of the load element, the first and second switching circuits operable in responsive to the input test voltage having approximately a voltage threshold value to turn on and develop a trigger voltage across the load element, and operable to alternately turn on responsive to the input test voltage being substantially different from the voltage threshold value to develop substantially no voltage across the load element;

a third switching circuit coupled across the load element, the third switching circuit developing a charging signal on an output to responsive to the activation voltage;

an energy storage element coupled to the output of the third switching circuit to receive the charging signal, the energy storage element storing energy from the charging signal to develop the test mode trigger signal, the developed test mode trigger signal having a value that is a function of a rate at which the storage element stores energy and the duration that the input voltage is approximately at the voltage threshold value; and a comparator circuit coupled to the energy storage element, the comparator developing the test mode clocking signal on an output responsive to the test mode trigger signal.

18. The test mode detection circuit of claim 17 wherein the first and third switching circuits comprise PMOS transistors, the second switching circuit comprises an NMOS transistor, the load element comprises a resistor, and the energy storage circuit comprises a capacitor coupled between a reference voltage source and the output of the third switching circuit, a resistor coupled in parallel with the capacitor, and a transistor having signal terminals coupled in parallel with the capacitor and having a control terminal adapted to receive a clock signal, the transistor coupling the signal terminals together to discharge the capacitor responsive to the clock signal.

19. A test mode detection circuit for developing a test mode latch signal indicating a test mode of operation of an integrated circuit is to be entered, the test mode detection circuit comprising:

a plurality of threshold detection circuits, each threshold detection circuit having an input adapted to receive an input test signal and having an output, and each threshold detection circuit operable in response to the corresponding input test signal having approximately a corresponding input threshold value for a corresponding triggering time to activate a corresponding test mode indication signal on the output, and operable in response to the corresponding input test signal being substantially different from the corresponding input threshold value or the input test signal not having the corresponding threshold value for the corresponding triggering time to deactivate the corresponding test mode indication signal on the output; and a mode evaluation circuit coupled to the outputs of the threshold detection circuits to receive the respective test mode indication signals, the mode evaluation circuit activating a test mode latching signal in response to all the respective test mode indication signals being active.

20. The test mode detection circuit of claim 19 wherein the inputs of each of the threshold detection circuits is adapted to receive the same input test signal and each of the threshold detection circuits has a different input threshold value, and wherein the mode evaluation circuit activates the test mode latching signal when each of the respective test mode indication signals goes active in response to the input test signal being maintained at approximately the respective input threshold values for a corresponding triggering time of the threshold detection circuits.

21. The test mode detection circuit of claim 19 wherein each of the respective triggering times of the respective threshold detection circuits has a different value.

22. The test mode detection circuit of claim 19 wherein the mode evaluation circuit comprises a state machine.

23. The test mode detection circuit of claim 19 wherein the plurality of threshold detection circuits equals two, and the input test signals applied to the two external terminals correspond to a pair of complementary digital signals.

24. The test mode detection circuit of claim 19 wherein each of the threshold detection circuits has a different input threshold value.

25. The test mode detection circuit of claim 19 wherein the mode evaluation circuit further comprises a test mode register adapted to receive a plurality of test mode signals applied on respective external terminals, the test mode latching signal being applied to the register to latch the test mode signals responsive to the test mode latch signal going active, and the register applying the latched test mode signals on an output responsive to a test mode enable signal.

26. A memory device, comprising:

an address bus;
a control bus;
a data bus;
an address decoder coupled to the address bus;
a control circuit coupled to the control bus;
a read/write circuit coupled to the data bus;
a memory-cell array coupled to the address decoder, read/write circuit, and control circuit, the array having a plurality of memory cells arranged in rows and columns, each memory cell storing a bit of data;
a threshold detection circuit for developing a test mode trigger signal, the threshold detection circuit having first and second switching circuits having control terminals adapted to receive an input signal and first and second signal terminals, the first and second signal terminals of the first switching circuit being coupled between a supply voltage source and a first terminal of a load element, and the first and second terminals of the second switching circuit being coupled between a reference voltage source and a second terminal of the load element, the first and second switching circuits operable in responsive to the input signal having approximately a voltage threshold value to turn on and develop a trigger voltage across the load element, and operable to alternately turn on responsive to the input signal being substantially different from the voltage threshold value to develop substantially no voltage across the load element;

a third switching circuit coupled across the load element, the third switching circuit developing a charging signal on an output to responsive to the trigger voltage; and an energy storage element coupled to the output of the third switching circuit to receive the charging signal, the energy storage element storing energy from the charging signal to develop the mode trigger signal, the developed mode trigger signal having a value that is a function of a rate at which the storage element stores energy and the duration that the input voltage is approximately at the voltage threshold value.

27. The memory device of claim 26 wherein the memory device comprises an SRAM.

28. A computer system, comprising:
a data input device;
a data output device;
an address bus;
a data bus;
a control bus; and
computing circuitry coupled to the data input and output devices, and the data, address, and control busses, the computing circuitry including a memory device including,
an address bus;
a control bus;
a data bus;
an address decoder coupled to the address bus;
a control circuit coupled to the control bus;
a read/write circuit coupled to the data bus;
a memory-cell array coupled to the address decoder read/write circuit, and control circuit, the array having a plurality of memory cells arranged in rows and columns, each memory cell storing a bit of data;
a threshold detection circuit for developing a test mode trigger signal, the threshold detection circuit having first and second switching circuits having control terminals adapted to receive an input signal and first and second signal terminals, the first and second signal terminals of the first switching circuit being coupled between a supply voltage source and a first terminal of a load element, and the first and second terminals of the second switching circuit being coupled between a reference voltage source and a second terminal of the load element, the first and second switching circuits operable in responsive to the input signal having approximately a voltage threshold value to turn on and develop a trigger voltage across the load element, and operable to alternately turn on responsive to the input signal being substantially different from the voltage threshold value to develop substantially no voltage across the load element;

a third switching circuit coupled across the load element, the third switching circuit developing a charging signal on an output to responsive to the trigger voltage; and an energy storage element coupled to the output of the third switching circuit to receive the charging signal, the energy storage element storing energy from the charging signal to develop the mode trigger signal, the developed mode trigger signal having a value that is a function of a rate at which the storage element stores energy and the duration that the input voltage is approximately at the voltage threshold value.

29. The computer system of claim 28 wherein the memory device comprises an SRAM.

30. A threshold detection circuit for developing a midpoint signal, comprising:
an input adapted to receive an input signal;
an output;
a first differential amplifier having a first input adapted to receive a first reference voltage and a second input coupled to receive the input signal, and having an output;
a second differential amplifier having a first input adapted to receive a second reference voltage and a second input coupled to receive the input signal, and having an output;
wherein the threshold detection circuit is operable in response to the input signal having a midpoint value to activate a midpoint signal on the output; and
wherein the threshold detection circuit is operable in response to the input signal being substantially different from the midpoint value to deactivate the midpoint signal on the output.

31. The threshold detection circuit of 30 wherein the threshold detection circuit is operable to activate the midpoint signal responsive to the input signal having the midpoint value for a time.

32. The threshold detection circuit of 30 wherein the first reference voltage is a supply voltage, the second reference voltage is ground, and wherein the first transistor is a PMOS transistor and the second transistor is an NMOS transistor.

33. The threshold detection circuit of 30 further comprising:
an output circuit coupled to the outputs of the first and second differential amplifiers, and operable to develop an output signal responsive to the outputs of the differential amplifiers.

34. A method of detecting a test mode of operation of an integrated circuit, the integrated circuit including an external terminal coupled to an input circuit contained within the integrated circuit, the input circuit having an input threshold value, and the method comprising:
applying a periodic test signal to the external terminal having a duty cycle to the external terminal, the test signal being maintained at the input threshold value for a portion of the duty cycle;
counting the number of periods of the periodic test signal that are applied to the external terminal; and
detecting a test mode of operation when a number of periods of the applied period test signal have been counted.

35. The method of claim 34 wherein the input threshold value comprises a voltage threshold having a value.

36. The method of claim 34 wherein the input circuit contained within the integrated circuit comprises an inverter.

37. A method of detecting a test mode of operation of an integrated circuit, the integrated circuit including a plurality of external terminals, each external terminal being coupled to an input circuit contained within the integrated circuit and each input circuit having an input threshold value, the method comprising:
applying respective test signals to the external terminals; and
detecting a test mode of operation when each of the respective applied test signals is maintained at approximately the corresponding input threshold value for a corresponding triggering time, each of the input threshold values has a different value.

38. The method of claim 37 wherein detecting a test mode of operation comprises detecting a test mode of operation when each of the respective test signals is maintained at approximately the corresponding input threshold value for the corresponding triggering time, and each of the triggering times has a different value.

39. The method of claim 37 wherein each of the input circuits contained within the integrated circuit comprises an inverter.

40. A threshold detection circuit for developing a midpoint signal, comprising:
an input adapted to receive an input signal;
an output;
a first transistor having a first signal node adapted to receive a first reference voltage, a second signal node, and a control node coupled to receive the input signal;
a second transistor having a first signal node adapted to receive a second reference voltage, a second signal node, and a control node coupled to receive the input signal;
a resistor coupled between the second signal nodes;
a differential amplifier coupled to the second signal nodes of the first and second transistors, and operable to develop an output signal responsive to a voltage across the resistor;
wherein the threshold detection circuit is operable in response to the input signal having a midpoint value to activate a midpoint signal on the output; and
wherein the threshold detection circuit is operable in response to the input signal being substantially different from the midpoint value to deactivate the midpoint signal on the output.

41. The threshold detection circuit of claim 40 wherein the differential amplifier comprises an operational amplifier.

42. The threshold detection circuit of claim 40 wherein the first reference voltage is a supply voltage, the second reference voltage is ground, and wherein the first transistor is a PMOS transistor and the second transistor is an NMOS transistor.

* * * * *